United States Patent
Liu et al.

(10) Patent No.: US 9,613,845 B2
(45) Date of Patent: Apr. 4, 2017

(54) IMMERSION DE-TAPING

(71) Applicant: Taiwan Semiconductor Manufacturing Company, Ltd., Hsin-Chu (TW)

(72) Inventors: Ching Tasi Liu, Zhubei (TW); Fu-Chen Chang, Hsin-Chu (TW); Chien-Chen Li, Hsin-Chu (TW); Te Lung Liu, Taichung (TW); Kuo Liang Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 481 days.

(21) Appl. No.: 14/158,503

(22) Filed: Jan. 17, 2014

(65) Prior Publication Data

US 2015/0206784 A1  Jul. 23, 2015

(51) Int. Cl.
| | |
|---|---|
| *B29C 65/50* | (2006.01) |
| *B32B 37/12* | (2006.01) |
| *B32B 38/10* | (2006.01) |
| *B32B 39/00* | (2006.01) |
| *H01L 21/683* | (2006.01) |

(52) U.S. Cl.
CPC .......... *H01L 21/6836* (2013.01); *B32B 38/10* (2013.01); *B32B 2310/04* (2013.01); *B32B 2457/14* (2013.01); *H01L 2221/6834* (2013.01); *H01L 2221/68327* (2013.01); *H01L 2221/68381* (2013.01); *H01L 2221/68386* (2013.01); *Y10T 156/1111* (2015.01); *Y10T 156/17* (2015.01)

(58) Field of Classification Search
USPC ........ 156/247, 701, 703, 706, 710, 538, 750
See application file for complete search history.

(56) References Cited

U.S. PATENT DOCUMENTS 5,254,201 A * 10/1993 Konda ................ B29C 63/0013
                                                                                    156/750
5,971,368 A * 10/1999 Nelson ..................... B08B 3/02
                                                                                    261/122.1

FOREIGN PATENT DOCUMENTS

| JP | EP 0989592 A1 * | 3/2000 | ....... H01L 21/67132 |
|---|---|---|---|
| JP | 2005019591 A | 1/2005 | |
| TW | I362064 B | 4/2012 | |
| TW | 201347863 A | 12/2013 | |

* cited by examiner

*Primary Examiner* — Sing P Chan
(74) *Attorney, Agent, or Firm* — Slater Matsil, LLP

(57) ABSTRACT

Embodiments using immersion de-taping are described. A substrate having a substrate tape attached thereto is provided. The substrate includes electrically conductive connectors attached to the substrate tape. A fluid is provided between the substrate and the substrate tape. While the fluid is between the substrate and the substrate tape, the substrate tape is removed from the substrate. Another embodiment is an apparatus comprising an immersion tank, a substrate chuck, first and second fixed rollers, and a moveable roller. The substrate chuck is configured to secure a substrate and to place the substrate into the immersion tank. The first fixed roller is operable to dispense a clamp tape. The second fixed roller is operable to roll the clamp tape. The moveable roller is operable to extend into the immersion tank and to adhere the clamp tape to a substrate tape on the substrate.

20 Claims, 7 Drawing Sheets

IMMERSION DE-TAPING

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and/or semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuit (3DIC) structures and packages have been developed to increase integration density. 3DIC structures generally require processing steps that may not have been required in conventional structures. These additional processing steps may introduce problems that were previously unknown with conventional structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
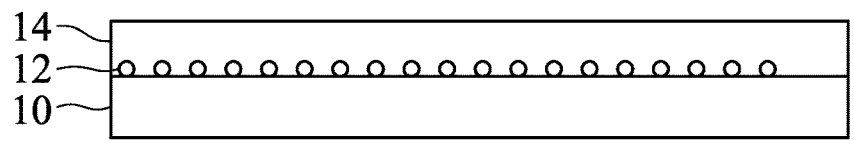
FIGS. 1 through 4 are an example of an immersion de-taping process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments will be described in a particular context, namely de-taping in semiconductor processing, such as an immersion de-taping process. A person of ordinary skill in the art will readily understand modifications of embodiments described herein, which are contemplated within the scope of other embodiments. For example, method embodiments may be described as being performed in a particular order, but other method embodiments may be performed in any logical order.

Figure 2:
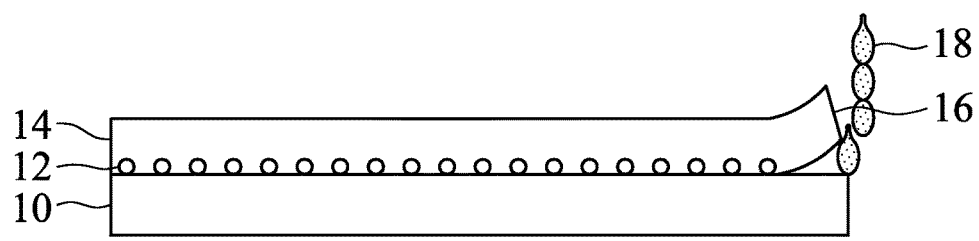
Figure 3:
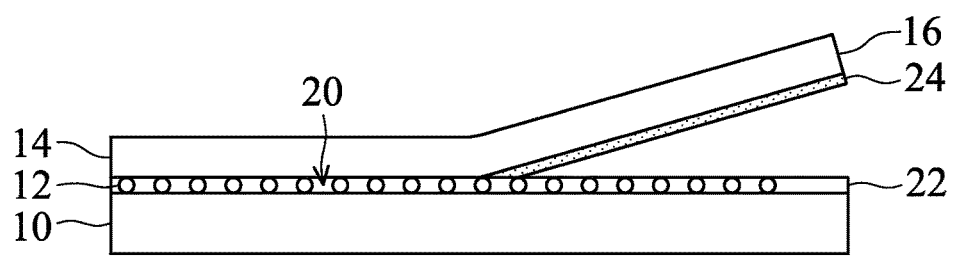
Figure 4:
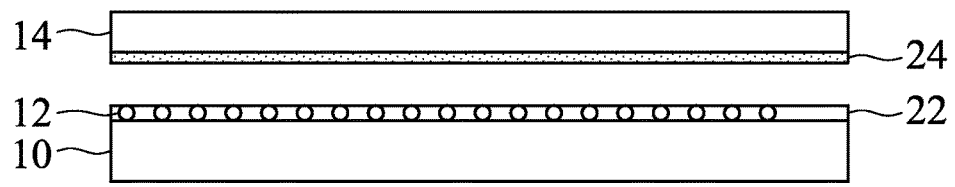

FIGS. 1 through 4 illustrate an example of an immersion de-taping process according to an embodiment. FIG. 1 illustrates a substrate 10, such as a wafer, after some processing step with electrically conductive connectors and/or bumps 12 (hereinafter referred to as "connectors"), such as controlled collapse chip connection (C4) bumps. The substrate 10 may comprise an electrical device, such as in an integrated circuit chip. A tape 14 is on the connectors 12 and the substrate 10. The tape 14 may be used as a mechanical support for the substrate 10 during a singulation process, for example. In FIG. 2, an edge 16 of the tape 14 is pulled away from the substrate 10. A fluid 18, such as deionized water, a fluid having a resistance between about $10^5$ ohms and about $10^9$ ohms, or the like, is applied at the edge 16 and between the tape 14 and the substrate 10. In some embodiments, the fluid 18 may be mixed with a gas, such as carbon dioxide ($CO_2$), ozone ($O_3$), another gas, or a combination thereof. In some embodiments, the fluid 18 has a pH value of about 7, and in other embodiments, the fluid 18 may have a pH value of less than 7 or greater than 7. A capillarity effect may draw the fluid 18 between the tape 14 and the substrate 10 and around the connectors 12. Hence, as illustrated in FIG. 3, a layer 20 of fluid 18 may be formed between the tape 14 and the substrate 10. As further illustrated in FIG. 3, the tape 14 is removed from the substrate 10 beginning at the edge 16 by peeling the tape 14 from the substrate 10. Residual layers 22 and 24 of fluid 18 on the substrate 10 and the tape 14, respectively, may remain after the tape 14 is removed from the substrate 10. In FIG. 4, the tape 14 is fully removed from the substrate 10.

The fluid 18 may be dispensed once at the beginning of the removal of the tape 14, continuously throughout the removal of the tape 14, or any variation or combination thereof. A capillarity effect may cause a layer 22 of fluid 18 to be formed throughout the substrate 10 surface, may cause a layer 22 of fluid 18 to only be present at a crease or seam where the tape 14 is being removed, or any variation thereof. Any residual layer 22 of fluid 18 on the substrate 10 and/or connectors 12 may be removed by a surface tension of the fluid 18 and/or by a subsequent cleaning process.

Figure 5:
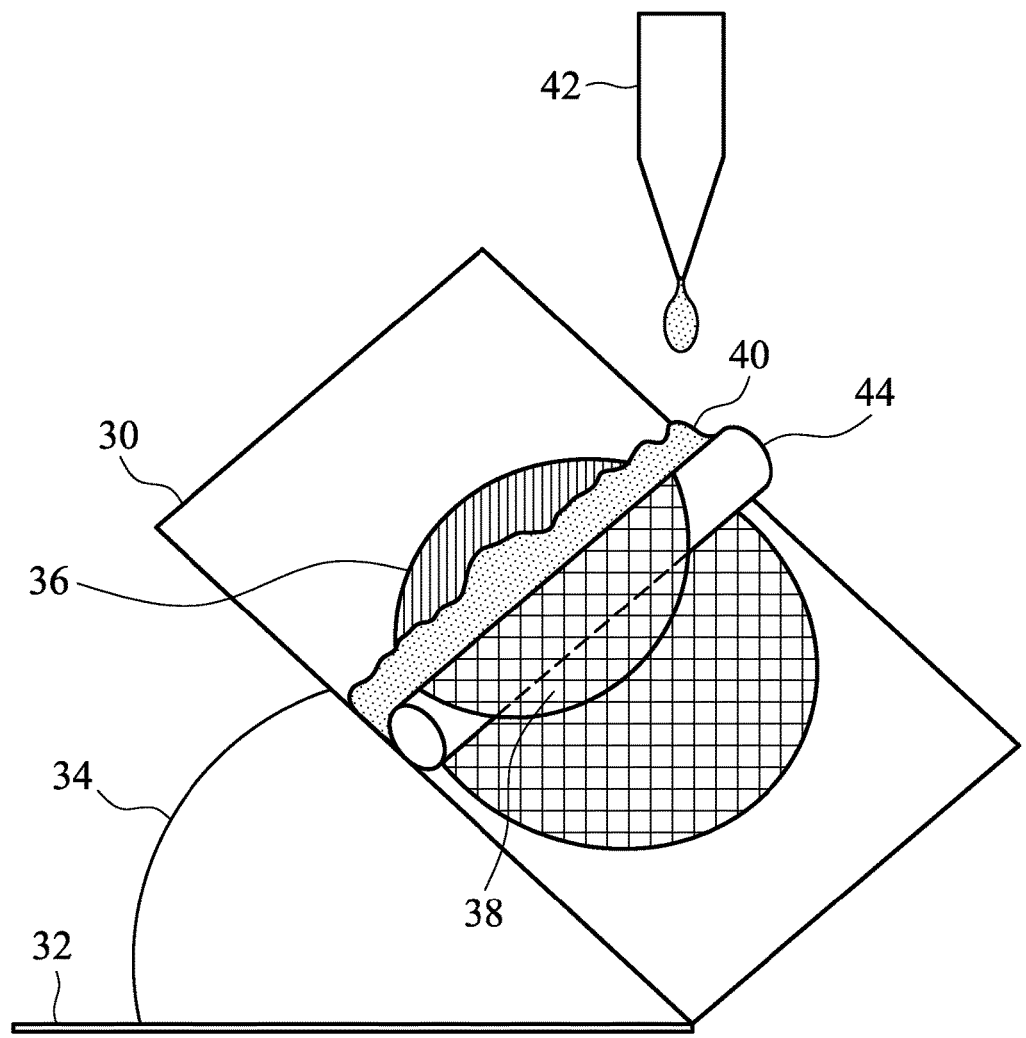
FIG. 5 is a first example de-taping apparatus and another example of an immersion de-taping process according to some embodiments.
Figure 6:
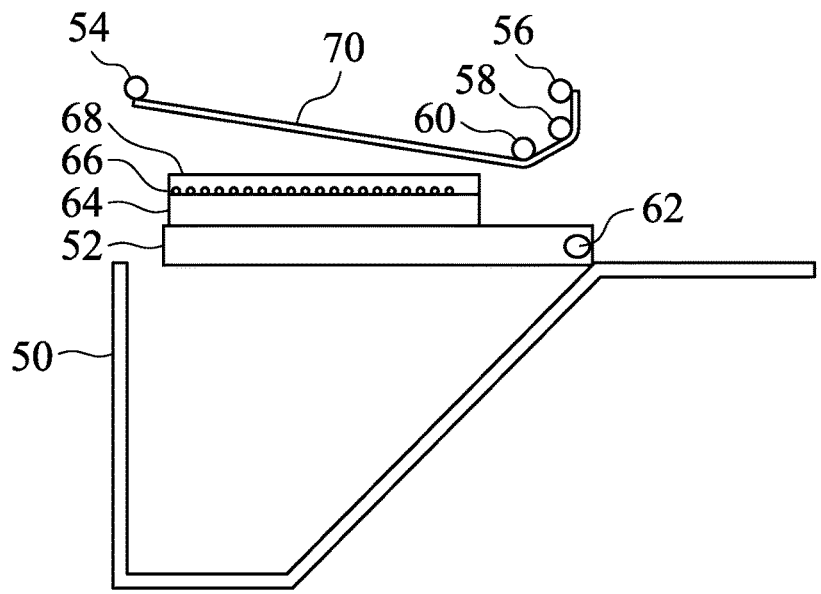
FIGS. 6 through 14 is a second example de-taping apparatus and another example of an immersion de-taping process according to some embodiments.

FIG. 5 illustrates an example de-taping apparatus and another example of an immersion de-taping process according to some embodiments. FIG. 5 shows a substrate support 30 that secures a substrate 36 during the de-taping process. The substrate support 30 is configurable to be inclined from a horizontal 32 at an angle 34. The angle 34 may be from between about 15 degrees and about 45 degrees from horizontal 32. The de-taping process begins at a highest edge of the substrate 36, which highest edge results from the incline. The edge of the tape 38 may be slightly peeled back, and a fluid 40 may be dispensed between the tape 38 and the substrate 36 at the edge. A capillarity effect and/or gravitational effect may pull the fluid 40 between the substrate 36 and the tape 38. The fluid 40 may be dispensed by a dispenser 42. The dispenser 42 may be a tube from a manually activated squeeze bottle or may be a tube from an automated dispenser configured to dispense the fluid. The fluid 40 may be dispensed once at the initiation of the removal of the tape 38, continuously throughout the removal of the tape, or any variation or combination thereof. A roller 44 may be used to aid in removing the tape 38 from the substrate 36. The roller 44 may aid in applying a uniform force to the tape 38 across a crease or seam where the tape 38 is being removed. The roller 44 movement may be implemented by rolling the roller 44 by manual activity or by an automated roller configured to remove the tape 38. After the tape 38 is removed from the substrate 36, any residual fluid 40 may be removed by a surface tension of the fluid 18 and/or by a subsequent cleaning process.

FIGS. 6 through 14 illustrate an example de-taping apparatus and another example of an immersion de-taping process according to some embodiments. The apparatus comprises an immersion tank 50, a substrate chuck 52, fixed rollers 54 and 56, adjustable roller 58, and moveable roller 60. Operations of the various components described in this embodiment may be automated and/or manual. The substrate chuck 52 is configured to support and secure a substrate during the de-taping process and is configured to be rotatable around a pivot 62. At the beginning of the process, a substrate 64 having connectors 66 and a tape 68 is on the substrate chuck 52 while the substrate chuck 52 is in a horizontal position. A clamp tape 70 is provided on fixed rollers 54 and 56. Unused portions of the clamp tape 70 may be dispensed from fixed roller 56, and used portions of the claim tape 70 may be rolled on the fixed roller 54. The clamp tape 70 may be a single-sided adhesive film capable of adhering to the tape 68 and removing the tape 68 as discussed herein. The moveable roller 60 is configured to extend into the immersion tank 50 and to adhere the clamp tape 70 to the tape 68, as shown in later figures. The adjustable roller 58 may be used to provide the clamp tape 70 dispensing at an appropriate angle with respect to an immersed tape 68 on a substrate 64. In embodiments, the adjustable roller 58 may be omitted, such as if the fixed roller 56 dispenses the clamp tape 70 at an appropriate angle.

Figure 7:
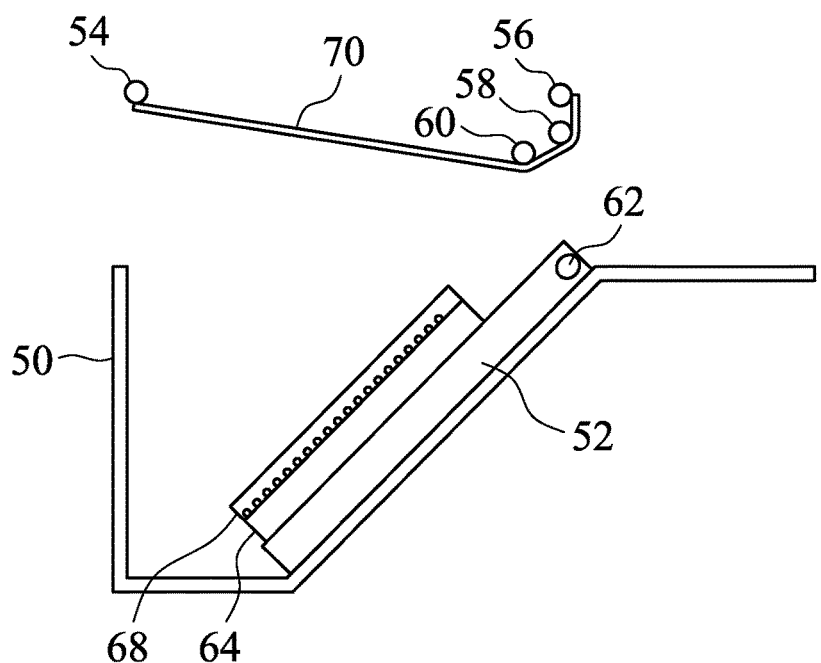

In FIG. 7, the substrate chuck 52, with the substrate 64 and tape 68, is lowered into the immersion tank 50. In this embodiment, the substrate chuck 52 is lowered into the immersion tank 50 by rotating the substrate chuck 52 around the pivot 62 by, for example, between about 15 degrees and 45 degrees. Other embodiments contemplate lowering the substrate 64 and tape 68 into the immersion tank 50 by other methods, such as lowering the substrate chuck 52 in a horizontal orientation into the immersion tank 50.

Figure 8:
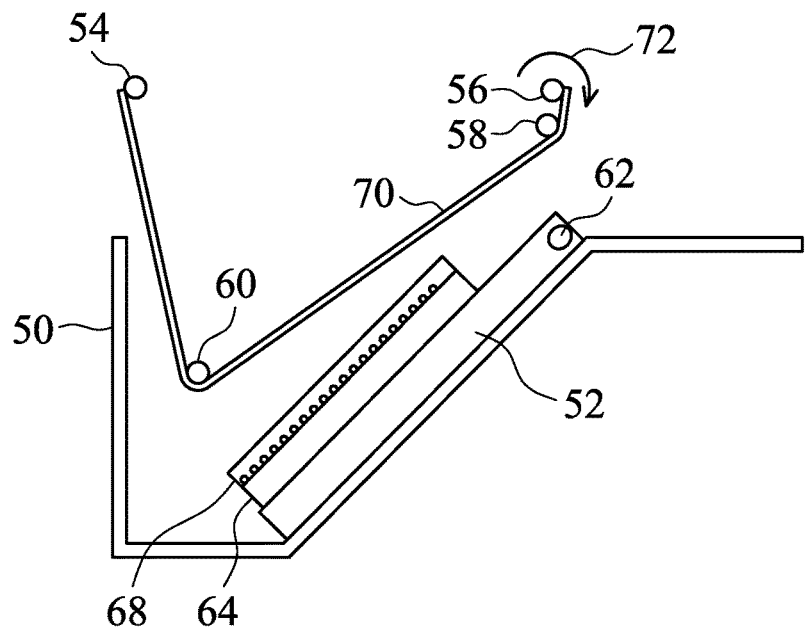

In FIG. 8, the moveable roller 60 extends into the immersion tank 50. By extending in this manner, the moveable roller 60 causes previously unused portions of the clamp tape 70 to be dispensed from the fixed roller 56. In this illustrated embodiment, the dispensing from the fixed roller 56 is shown by a clockwise rotation 72 of the fixed roller 56. During this dispensing, the fixed roller 54 may not rotate, such as by applying a braking mechanism to the fixed roller 54, such that a previously used portion of the clamp tape 70 is not inadvertently dispensed from the fixed roller 54.

Figure 9:
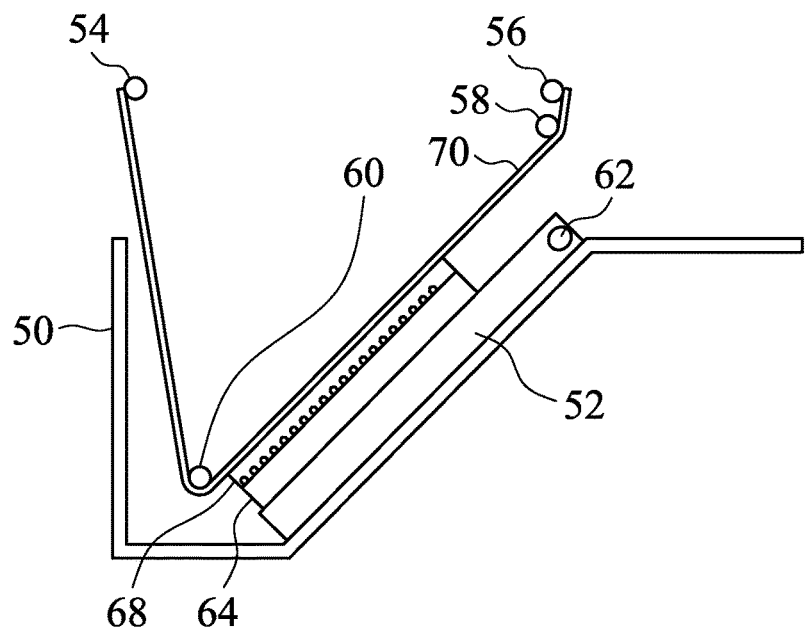

In FIG. 9, the moveable roller 60 fully extends into the immersion tank 50 such that a portion of the clamp tape 70 meets a top surface of the tape 68. As illustrated, a plane of a portion of the clamp tape 70 between the moveable roller 60 and the adjustable roller 58 is parallel to a top surface of the tape 68. This portion of the clamp tape 70 may meet and adhere to the top surface of the tape 68.

Figure 10:
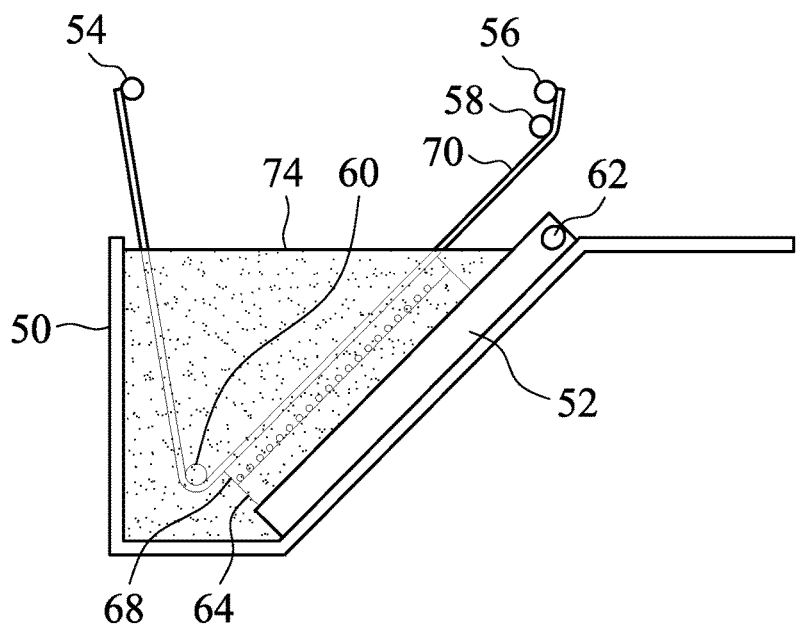

In FIG. 10, the immersion tank 50 is filled with a fluid 74. The fluid 74 may be deionized water, a fluid having a resistance between about $10^5$ ohms and about $10^9$ ohms, or the like. In some embodiments, the fluid 74 may be mixed with a gas, such as carbon dioxide ($CO_2$), ozone ($O_3$), another gas, or a combination thereof. In some embodiments, the fluid 74 has a pH value of about 7, and in other embodiments, the fluid 18 may have a pH value of less than 7 or greater than 7. The fluid 74 completely immerses the substrate 64 and tape 68, but in other embodiments, the fluid 74 does not completely immerse the substrate 64 and tape 68. The fluid 74 may penetrate between the tape 68 and the substrate 64 and around the connectors 66 by the tape 68, connectors 66, and substrate 64 being immersed and/or by a capillarity effect. The fluid 74 may flow into the immersion tank 50 from spigot or the like on the immersion tank 50.

Figure 11:
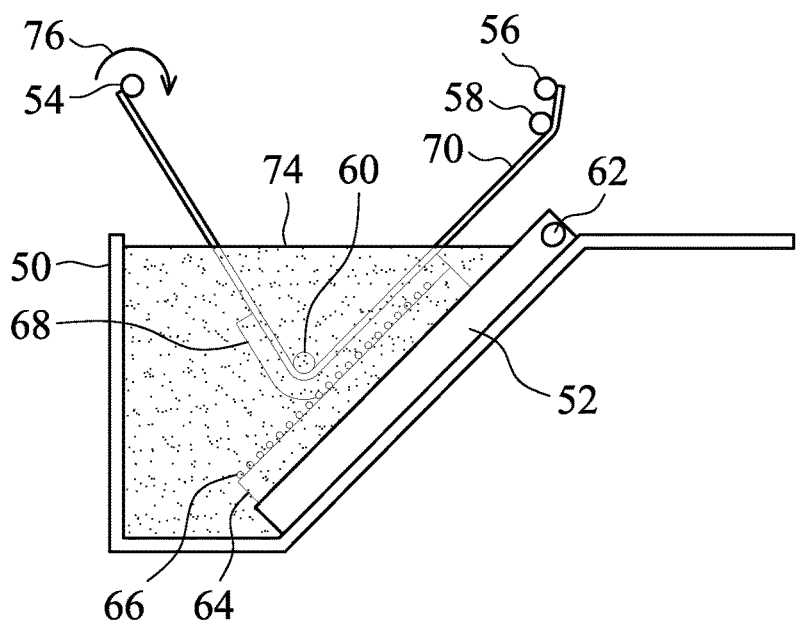

In FIG. 11, the fixed roller 54 begins to roll the clamp tape 70. The rolling action is illustrated by clockwise rotation 76 of the fixed roller 54. While the fixed roller 54 rolls the clamp tape 70, the moveable roller 60 remains extended such that tension remains on the clamp tape 70, and the moveable roller 60 may traverse the clamp tape 70 along the top surface of the tape 68 to provide a pressure to ensure adequate adherence of the clamp tape 70 to the tape 68. As the clamp tape 70 is rolled by the fixed roller 54, the moveable roller 60 moves in a direction traversing the top surface of the tape 68 and towards the adjustable roller 58. With the rolling of the clamp tape 70 and the movement of the moveable roller 60, the tape 68 is removed from the substrate 64 and connectors 66, such as by peeling. During this rolling, the fixed roller 56 may not rotate, for example, by applying a braking mechanism to the fixed roller 56, such that a previously unused portion of the clamp tape 70 is not inadvertently dispensed from the fixed roller 56.

Figure 12:
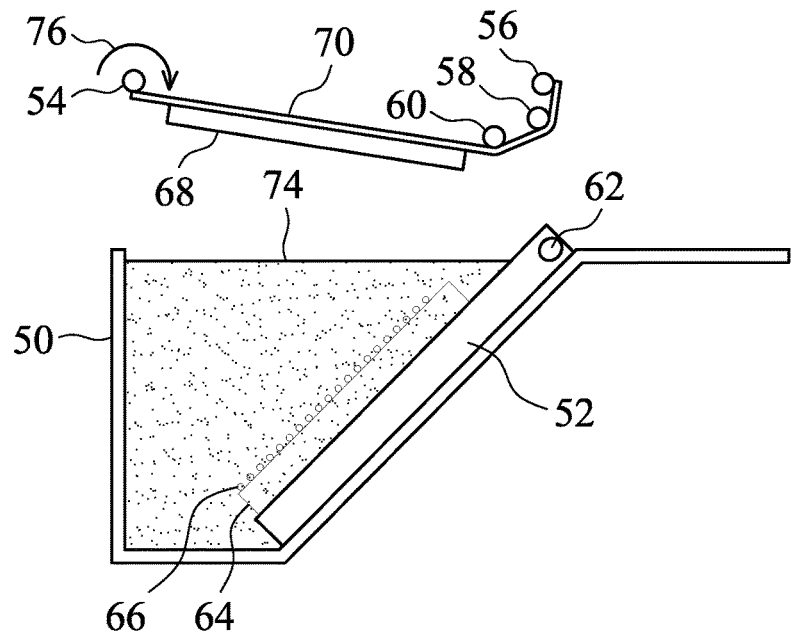

In FIG. 12, the fixed roller 54 continues its clockwise rotation 76 to roll the clamp tape 70 until the tape 68 is completely removed from the substrate 64 and connectors 66. The moveable roller 60 continues traversing in a direction towards the adjustable roller 58 until the moveable roller 60 reaches its original position.

Figure 13:
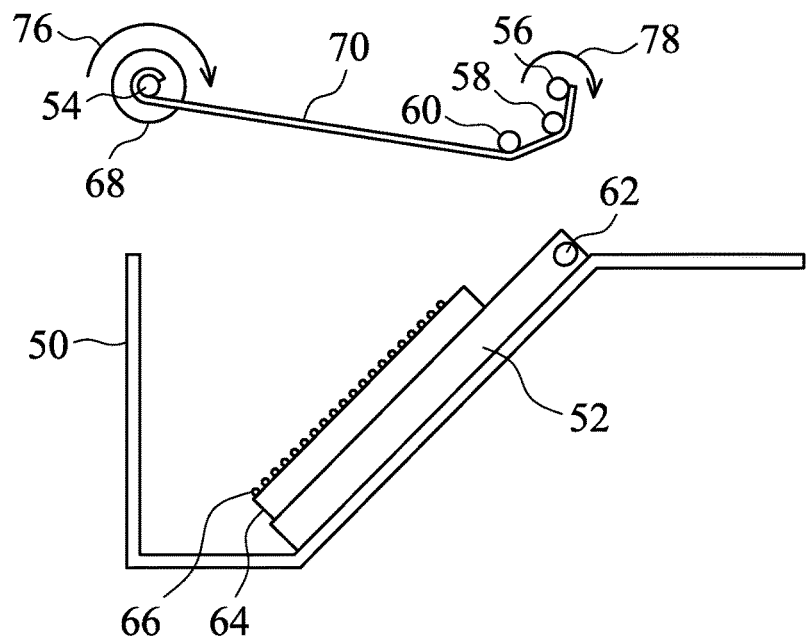

In FIG. 13, the fluid 74 is removed or drained from the immersion tank 50, such as by a drain on the immersion tank 50. As the fluid 74 is removed, a surface tension of the fluid 74 may remove substantially all of the fluid 74 from the substrate 64 and connectors 66. In an embodiment, a gas spray (not shown) may be applied to remove the fluid 74 from the substrate 64 and connectors 66. Additionally, the fixed roller 54 may continue its clockwise rotation 76 to roll the used portion of the clamp tape 70 and the tape 68 adhered to the clamp tape 70 onto the fixed roller 54. The fixed roller 56 may rotate in a clockwise rotation 78 while the clamp tape 70 and tape 68 are rolled onto the fixed roller 54 to dispense an unused portion of the clamp tape 70 to a position for use with a subsequent substrate and tape.

Figure 14:
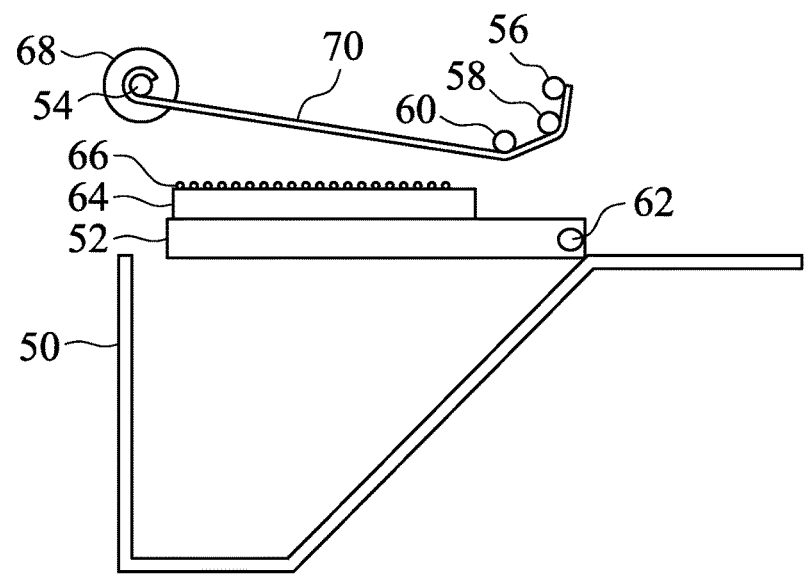

In FIG. 14, the substrate chuck 52 is returned to its horizontal position, such as by rotating the substrate chuck 52 around the pivot 62. The substrate 64 is de-taped and may be removed from the substrate chuck 52 for subsequent processing, which may include a cleaning step that may remove any residual fluid 74 remaining on the substrate 64 and connectors 66.

Figure 15:
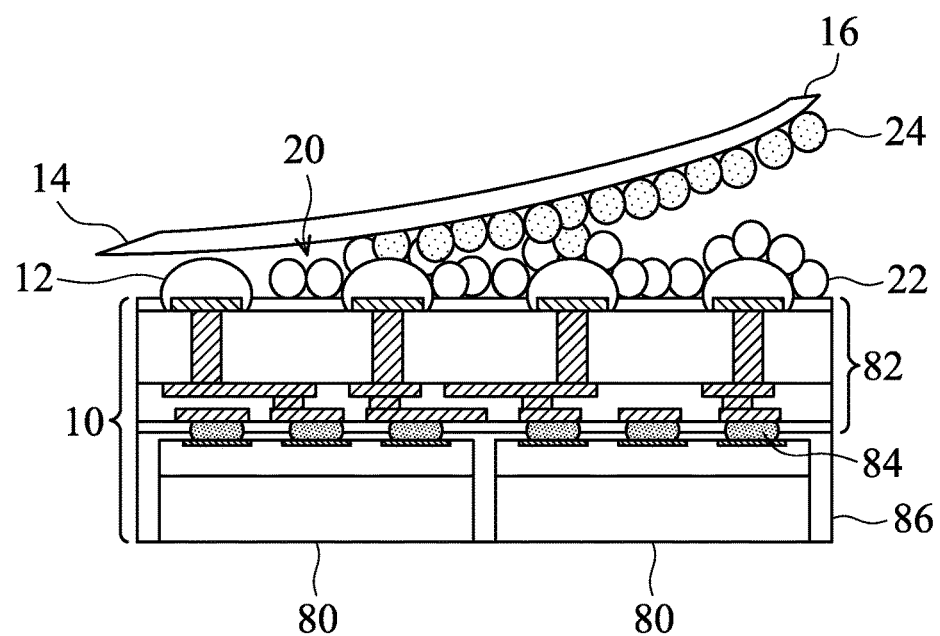
FIG. 15 illustrates an example structure to which an immersion de-taping process may be applied according to an embodiment.

FIG. 15 illustrates an example structure, for example a three dimensional integrated circuit (3DIC), to which an immersion de-taping process may be applied. The substrate 10 includes integrated circuit chips 80, with each comprising an electrical device, attached to an interposer 82 by conductive bumps 84, such as micro-bumps, and includes an encapsulant 86 encapsulating the chips 80. The interposer 82 includes an interposer substrate through which through substrate vias (TSVs) are formed. On a first side of the interposer substrate, a redistribution element is formed, such as one or more dielectric and metallization layers, to which the conductive bumps 84 and chips 80 are attached. On a second side of the interposer substrate, a metallization layer is formed, to which the connectors 12 are connected. The second side may also comprise a redistribution element. During processing, the TSVs may be formed in the interposer substrate (which may be a wafer during processing); the redistribution element may be formed on the first side of the interposer substrate; the chips 80 may be attached to the redistribution element; the chips 80 may be encapsulated by the encapsulant 86; and the second side of the interposer substrate may be processed to expose the TSVs, form the metallization layer, and form the connectors 12. Subsequently, the tape 14 is attached to the connectors 12 and the interposer 82 for singulation. After singulation, a de-taping process described above may be used to remove the tape 14 from the connectors 12 and the interposer 82.

Embodiments may achieve advantages. By using an immersion de-taping process, a contact area between the tape and the substrate may be reduced by having a fluid between the tape and substrate, which may result from a capillarity effect and/or gravitational effect. An electrostatic discharge (ESD) event may be reduced in magnitude (such as a lower voltage discharge) or avoided, which may result in a higher yield of products.

An embodiment is a method. A substrate having a substrate tape attached thereto is provided. The substrate includes electrically conductive connectors attached to the substrate tape. A fluid is provided between the substrate and the substrate tape. While the fluid is between the substrate and the substrate tape, the substrate tape is removed from the substrate.

Another embodiment is a method. A substrate is placed in an immersion tank. The substrate comprises electrically conductive connectors attached to a substrate tape. A clamp tape is adhered to the substrate tape. A fluid is provided in the immersion tank. While the fluid and the substrate are in the immersion tank, the clamp tape with the substrate tape adhered thereto are peeled from the substrate.

A yet further embodiment is an apparatus comprising an immersion tank, a substrate chuck, first and second fixed rollers, and a moveable roller. The substrate chuck is configured to secure a substrate and to place the substrate into the immersion tank. The first fixed roller is operable to dispense a clamp tape. The second fixed roller is operable to roll the clamp tape. The moveable roller is operable to extend into the immersion tank and to adhere the clamp tape to a substrate tape on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a substrate having a substrate tape attached thereto, the substrate comprising electrically conductive connectors attached to the substrate tape;
    providing a fluid between the substrate and the substrate tape; and
    while the fluid is between the substrate and the substrate tape, removing the substrate tape from the substrate, wherein the substrate is inclined during the removing the substrate tape from the substrate.

2. The method of claim 1, wherein the fluid comprises deionized water.

3. The method of claim 1, wherein the substrate comprises an electrical device.

4. The method of claim 1, wherein the providing the fluid between the substrate and tape comprises:
    providing an immersion tank with the fluid; and
    immersing the substrate and the substrate tape in the fluid in the immersion tank.

5. The method of claim 1, wherein the removing the substrate tape comprises:
    adhering a clamp tape to the substrate tape; and
    peeling the clamp tape with the substrate tape adhered to the clamp tape away from the substrate.

6. The method of claim 1, wherein the fluid has a pH value of about 7.

7. The method of claim 1, wherein an angle of inclination of the substrate is between about 15 degrees and about 45 degrees.

8. A method comprising:
    placing a substrate in an immersion tank, the substrate comprising electrically conductive connectors attached to a substrate tape;
    adhering a clamp tape to the substrate tape, wherein the clamp tape is adhered to the substrate tape while the substrate is in the immersion tank;
    providing a fluid in the immersion tank; and
    while the fluid and the substrate are in the immersion tank, peeling the clamp tape with the substrate tape adhered thereto from the substrate.

9. The method of claim 8, wherein the fluid comprises deionized water.

10. The method of claim 8, wherein placing the substrate in the immersion tank comprises rotating a substrate chuck around a pivot, the substrate being on the substrate chuck.

11. The method of claim 8, wherein the adhering the clamp tape comprises using a moveable roller to extend the clamp tape into the immersion tank to contact the clamp tape to the substrate tape.

12. The method of claim 8, wherein the providing the fluid in the immersion tank comprises placing the fluid in the immersion tank, the substrate being completely immersed in the fluid in the immersion tank.

13. The method of claim 8, wherein the adhering the clamp tape to the substrate tape comprises extending a moveable roller in the immersion tank to dispense the clamp tape from a first fixed roller, and wherein the peeling the clamp tape with the substrate tape adhered thereto from the substrate comprises rolling the clamp tape on a second fixed roller, the moveable roller traversing the substrate tape during the rolling.

14. The method of claim 8, wherein the fluid has a pH value of about 7.

15. The method of claim 8, wherein the substrate comprises:
- an interposer, the electrically conductive connectors being on a first side of the interposer; and
- an integrated circuit chip comprising an electrical device, the integrated circuit chip being attached to a second side of the interposer opposite from the first side.

16. The method of claim 8, wherein the fluid has a resistance between about $10^5$ ohms and about $10^9$ ohms.

17. A method comprising:
- attaching a first side of a substrate to a substrate chuck, a second side of the substrate comprising electrically conductive connectors attached to a substrate tape, the second side being opposite the first side;
- lowering the substrate into an immersion tank by rotating the substrate chuck around a pivot;
- after lowering the substrate into the immersion tank, adhering a clamp tape to the substrate tape;
- filling the immersion tank with a fluid; and
- while the substrate chuck with the substrate attached thereto are immersed in the fluid, peeling the clamp tape with the substrate tape adhered thereto from the second side of the substrate.

18. The method of claim 17, further comprising:
- draining the fluid from the immersion tank; and
- raising the substrate from the immersion tank by rotating the substrate chuck around the pivot.

19. The method of claim 17, wherein the adhering the clamp tape to the substrate tape comprises extending a moveable roller into the immersion tank to dispense the clamp tape from a first fixed roller, and wherein the peeling the clamp tape with the substrate tape adhered thereto from the second side of the substrate comprises rolling the clamp tape on a second fixed roller, the moveable roller moving from a first edge of the substrate toward a second edge of the substrate during the rolling, the first edge being opposite the second edge.

20. The method of claim 17, wherein the fluid comprises deionized water mixed with carbon dioxide ($CO_2$), ozone ($O_3$), or a combination thereof.

* * * * *